United States Patent
Xia et al.

(10) Patent No.: US 9,129,856 B2
(45) Date of Patent: Sep. 8, 2015

(54) METHOD FOR EFFICIENTLY FABRICATING MEMORY CELLS WITH LOGIC FETS AND RELATED STRUCTURE

(75) Inventors: Wei Xia, Irvine, CA (US); Xiangdong Chen, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 13/179,248

(22) Filed: Jul. 8, 2011

(65) Prior Publication Data
US 2013/0009231 A1 Jan. 10, 2013

(51) Int. Cl.
*H01L 27/115* (2006.01)
*H01L 21/8238* (2006.01)

(52) U.S. Cl.
CPC ... *H01L 27/11534* (2013.01); *H01L 21/823842* (2013.01)

(58) Field of Classification Search
CPC .............................................. H01L 21/823842
USPC ..................... 257/316, 368, E21.616, E27.06
See application file for complete search history.

(56) References Cited

U.S. PATENT DOCUMENTS

| | | | |
|---|---|---|---|
| 6,037,222 A * | 3/2000 | Huang et al. ................. | 438/257 |
| 6,333,223 B1 * | 12/2001 | Moriwaki et al. ............ | 438/241 |
| 6,387,789 B1 * | 5/2002 | Kim .............................. | 438/592 |
| 6,929,992 B1 * | 8/2005 | Djomehri et al. ............ | 438/199 |
| 7,109,536 B2 * | 9/2006 | Nakabayashi ................ | 257/290 |
| 7,217,610 B2 * | 5/2007 | Graf et al. ..................... | 438/210 |
| 7,307,324 B2 * | 12/2007 | Uchiyama ..................... | 257/397 |
| 7,495,298 B2 * | 2/2009 | Hayashi et al. ............... | 257/412 |
| 7,915,111 B2 * | 3/2011 | Yang et al. .................... | 438/199 |
| 7,968,410 B2 * | 6/2011 | Jung et al. .................... | 438/287 |
| 8,039,381 B2 * | 10/2011 | Yeh et al. ...................... | 438/595 |
| 8,153,498 B2 * | 4/2012 | Hsu et al. ..................... | 438/382 |
| 8,174,079 B2 * | 5/2012 | Aoyama ....................... | 257/369 |
| 8,404,535 B2 * | 3/2013 | Yu et al. ........................ | 438/199 |
| 2003/0211691 A1 * | 11/2003 | Ueda ............................ | 438/258 |
| 2005/0051850 A1 * | 3/2005 | Inaba ............................ | 257/368 |
| 2005/0208699 A1 * | 9/2005 | Furkay et al. ................. | 438/102 |
| 2006/0008968 A1 * | 1/2006 | Brask et al. ................... | 438/206 |
| 2006/0043461 A1 * | 3/2006 | Zuliani et al. ................ | 257/315 |
| 2006/0177979 A1 * | 8/2006 | Tu ................................. | 438/243 |
| 2006/0263961 A1 * | 11/2006 | Kittl et al. .................... | 438/199 |
| 2006/0292799 A1 * | 12/2006 | Nakabayashi ................ | 438/258 |
| 2007/0228458 A1 * | 10/2007 | Henson et al. ................ | 257/327 |
| 2008/0036008 A1 * | 2/2008 | Hirase et al. ................. | 257/369 |

(Continued)

*Primary Examiner* — Yu-Hsi D Sun
*Assistant Examiner* — Ankush Singal
(74) *Attorney, Agent, or Firm* — Oblon, McClelland, Maier & Neustadt, L.L.P.

(57) ABSTRACT

According to one exemplary embodiment, a method for concurrently fabricating a memory region with a logic region in a common substrate includes forming a lower dielectric segment in the common substrate in the memory and logic regions. The method also includes forming a polysilicon segment over the lower dielectric segment in the memory region, while concurrently forming a sacrificial polysilicon segment over the lower dielectric segment in the logic region. Furthermore, the method includes removing from the logic region the lower dielectric segment and the sacrificial polysilicon segment. The method additionally includes forming a high-k segment in the logic region over the common substrate, and in the memory region over the polysilicon segment and forming a metal segment over the high-k segment in the logic and memory regions. An exemplary structure achieved by the described exemplary method is also disclosed.

20 Claims, 8 Drawing Sheets

(56) References Cited

U.S. PATENT DOCUMENTS

| | | | |
|---|---|---|---|
| 2009/0104742 A1* | 4/2009 | Pas | 438/230 |
| 2009/0159978 A1* | 6/2009 | Matsubara et al. | 257/368 |
| 2009/0230479 A1* | 9/2009 | Hsu et al. | 257/369 |
| 2009/0283835 A1* | 11/2009 | Yu et al. | 257/368 |
| 2010/0006932 A1* | 1/2010 | Matsubara | 257/334 |
| 2010/0019306 A1* | 1/2010 | Lojek et al. | 257/316 |
| 2010/0038696 A1* | 2/2010 | Power et al. | 257/316 |
| 2010/0052058 A1* | 3/2010 | Hsu et al. | 257/364 |
| 2010/0052060 A1* | 3/2010 | Lai et al. | 257/368 |
| 2010/0059833 A1* | 3/2010 | Yu et al. | 257/410 |
| 2010/0065926 A1* | 3/2010 | Yeh et al. | 257/410 |
| 2010/0276757 A1* | 11/2010 | Doyle et al. | 257/368 |
| 2011/0057267 A1* | 3/2011 | Chuang et al. | 257/380 |
| 2011/0062526 A1* | 3/2011 | Xu et al. | 257/369 |
| 2011/0104880 A1* | 5/2011 | Heinrich et al. | 438/585 |
| 2011/0108903 A1* | 5/2011 | Xia et al. | 257/316 |
| 2011/0108922 A1* | 5/2011 | Liu et al. | 257/369 |
| 2011/0156154 A1* | 6/2011 | Hoentschel et al. | 257/369 |
| 2011/0156166 A1* | 6/2011 | Huang et al. | 257/392 |
| 2011/0198699 A1* | 8/2011 | Hung et al. | 257/369 |
| 2011/0211394 A1* | 9/2011 | Scheiper et al. | 365/185.18 |
| 2011/0212548 A1* | 9/2011 | Kanakasabapathy et al. | 438/8 |
| 2011/0230042 A1* | 9/2011 | Chew et al. | 438/591 |
| 2011/0254060 A1* | 10/2011 | Yang et al. | 257/288 |
| 2011/0263113 A1* | 10/2011 | Matsubara et al. | 438/585 |
| 2011/0266637 A1* | 11/2011 | Lee et al. | 257/410 |
| 2011/0284966 A1* | 11/2011 | Wen et al. | 257/368 |
| 2011/0309434 A1* | 12/2011 | Huang et al. | 257/326 |
| 2012/0012948 A1* | 1/2012 | Yeh et al. | 257/412 |
| 2012/0032230 A1* | 2/2012 | Yin et al. | 257/192 |
| 2012/0086075 A1* | 4/2012 | Huang et al. | 257/334 |
| 2012/0119306 A1* | 5/2012 | Ho et al. | 257/401 |
| 2012/0289040 A1* | 11/2012 | Huang et al. | 438/591 |
| 2012/0292708 A1* | 11/2012 | Chen et al. | 257/368 |
| 2012/0322246 A1* | 12/2012 | Wang et al. | 438/488 |

* cited by examiner

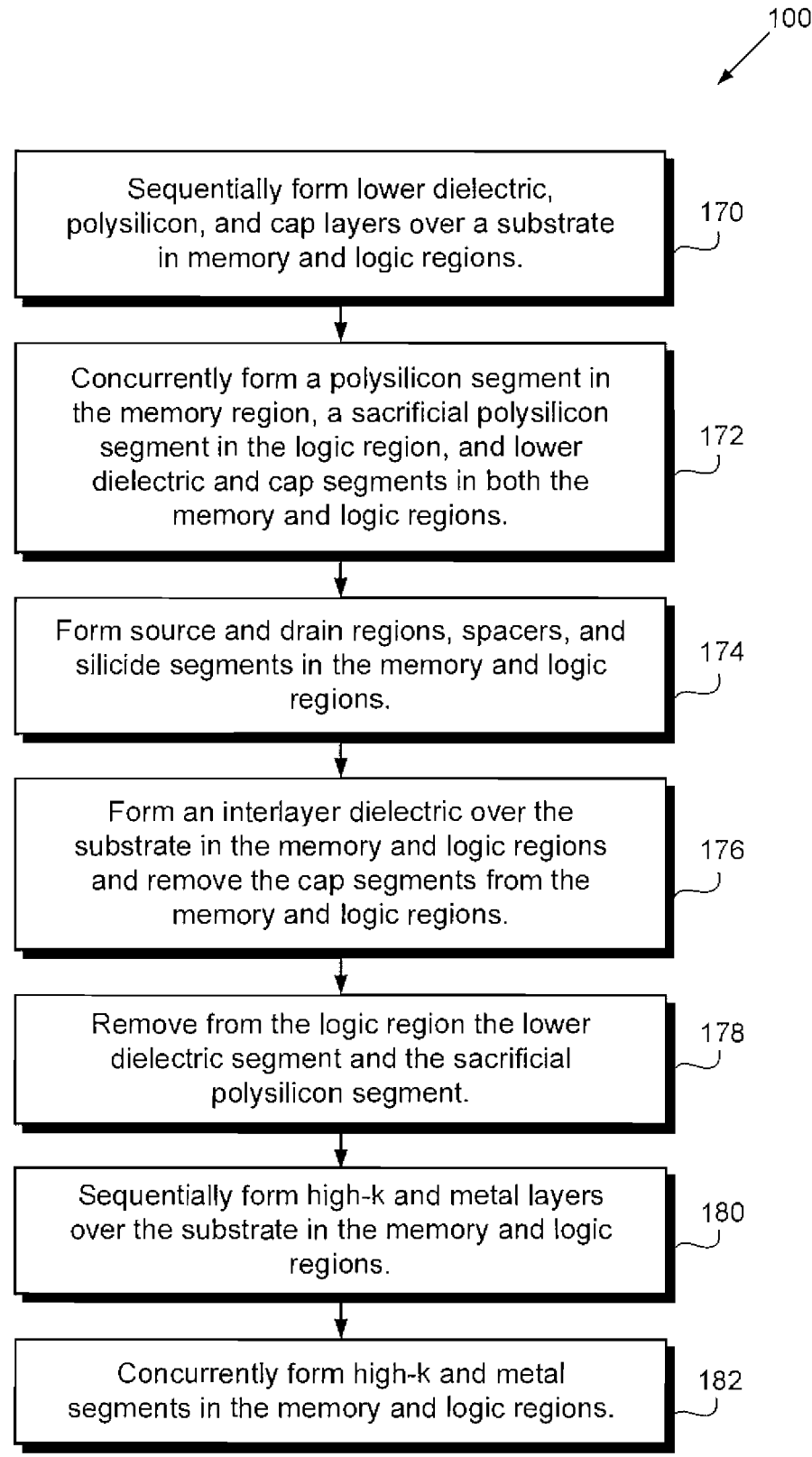

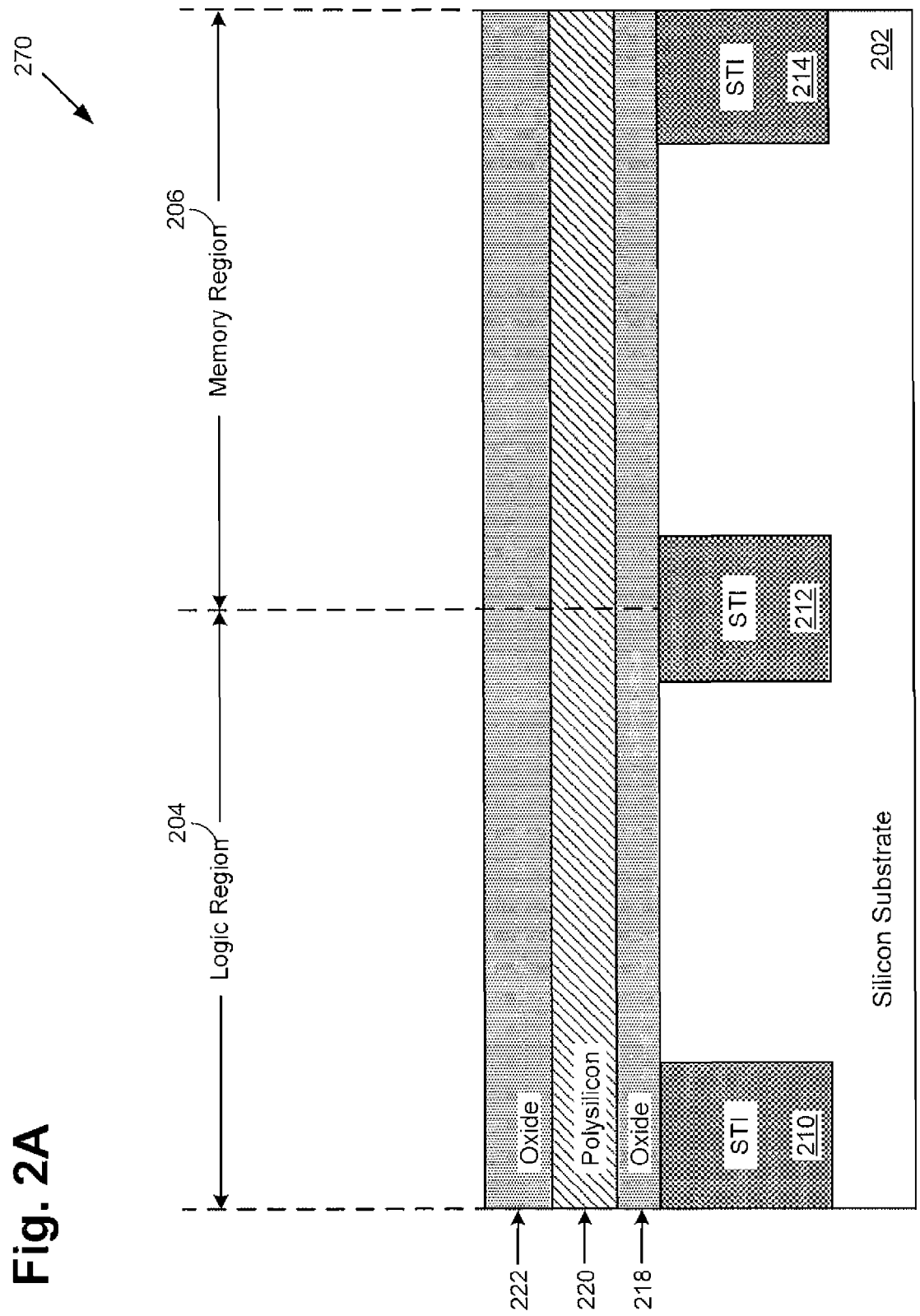

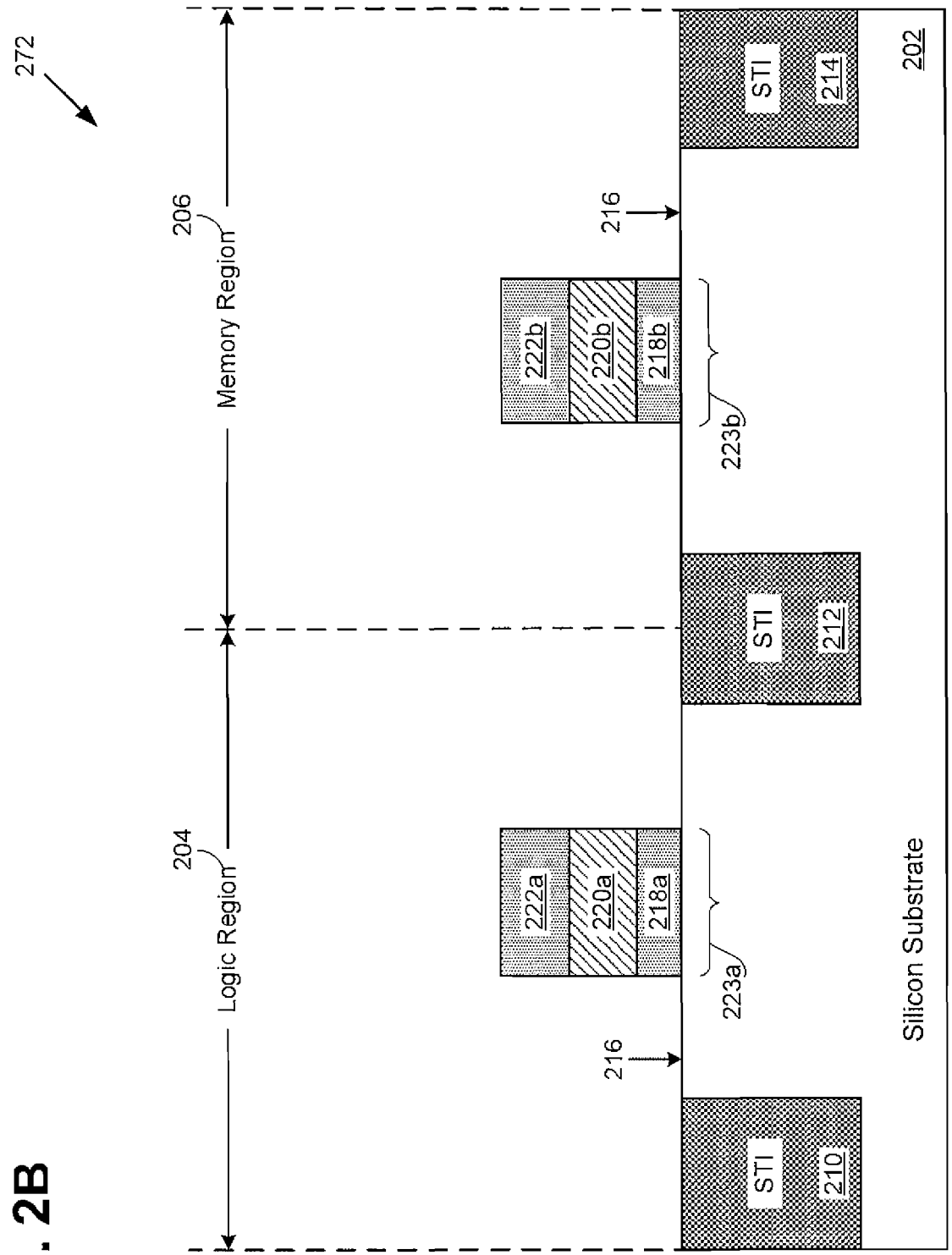

METHOD FOR EFFICIENTLY FABRICATING MEMORY CELLS WITH LOGIC FETS AND RELATED STRUCTURE

BACKGROUND OF THE INVENTION

1. Field of the Invention

The present invention is generally in the field of semiconductors. More particularly, the invention is in the field of the fabrication of memory cells.

2. Background Art

Memory cells and logic field-effect transistors (FETs) are widely utilized in electronic systems for cell phones, computers, and other electronic devices. The memory cells and the logic FETs can be fabricated on separate semiconductor dies. However, it is desirable to integrate memory cells with logic FETs in a common substrate in a system-on-chip (SoC) for increased performance, lower manufacturing cost, and system reconfigurability. It is further desirable to integrate memory cells and logic FETs in an SoC by utilizing advanced process technologies, such as 45.0 nanometer (nm) and smaller process technologies.

In advanced process technologies, logic FETs typically include a gate that can be fabricated by utilizing a high dielectric constant (high-k) metal gate process to achieve gate oxide scaling. Integrating memory cell fabrication with the high-k metal gate process to fabricate the memory cells with the logic FETs can require additional masks and process steps. For example, memory cells, such as flash memory cells, can include a floating gate and an overlying control gate, where the floating gate and the control gate are fabricated by utilizing a polysilicon (e.g., poly-SiON) gate process. As such, additional masks and process steps are required to integrate flash memory cells, fabricated by utilizing the polysilicon gate process, and logic FETs, fabricated by utilizing the high-k metal gate process, in an SoC. This is inefficient and can undesirably increase manufacturing cost.

Thus, there is a need in the art for efficiently fabricating memory cells with logic FETs.

SUMMARY OF THE INVENTION

Method for efficiently fabricating memory cells with logic FETs and related structure are disclosed. Features, advantages and various embodiments of the present invention are shown in and/or described in connection with at least one of the drawings, and are set forth more completely in the claims.

BRIEF DESCRIPTION OF THE DRAWINGS

FIG. 1 shows a flowchart illustrating the steps taken to implement an embodiment of the present invention.

FIG. 2A illustrates a cross-sectional view, which includes a portion of a wafer processed according to an embodiment of the invention, corresponding to an initial step in the flowchart in FIG. 1.

FIG. 2B illustrates a cross-sectional view, which includes a portion of a wafer processed according to an embodiment of the invention, corresponding to an intermediate step in the flowchart in FIG. 1.

DETAILED DESCRIPTION OF THE INVENTION

Figure 2C:
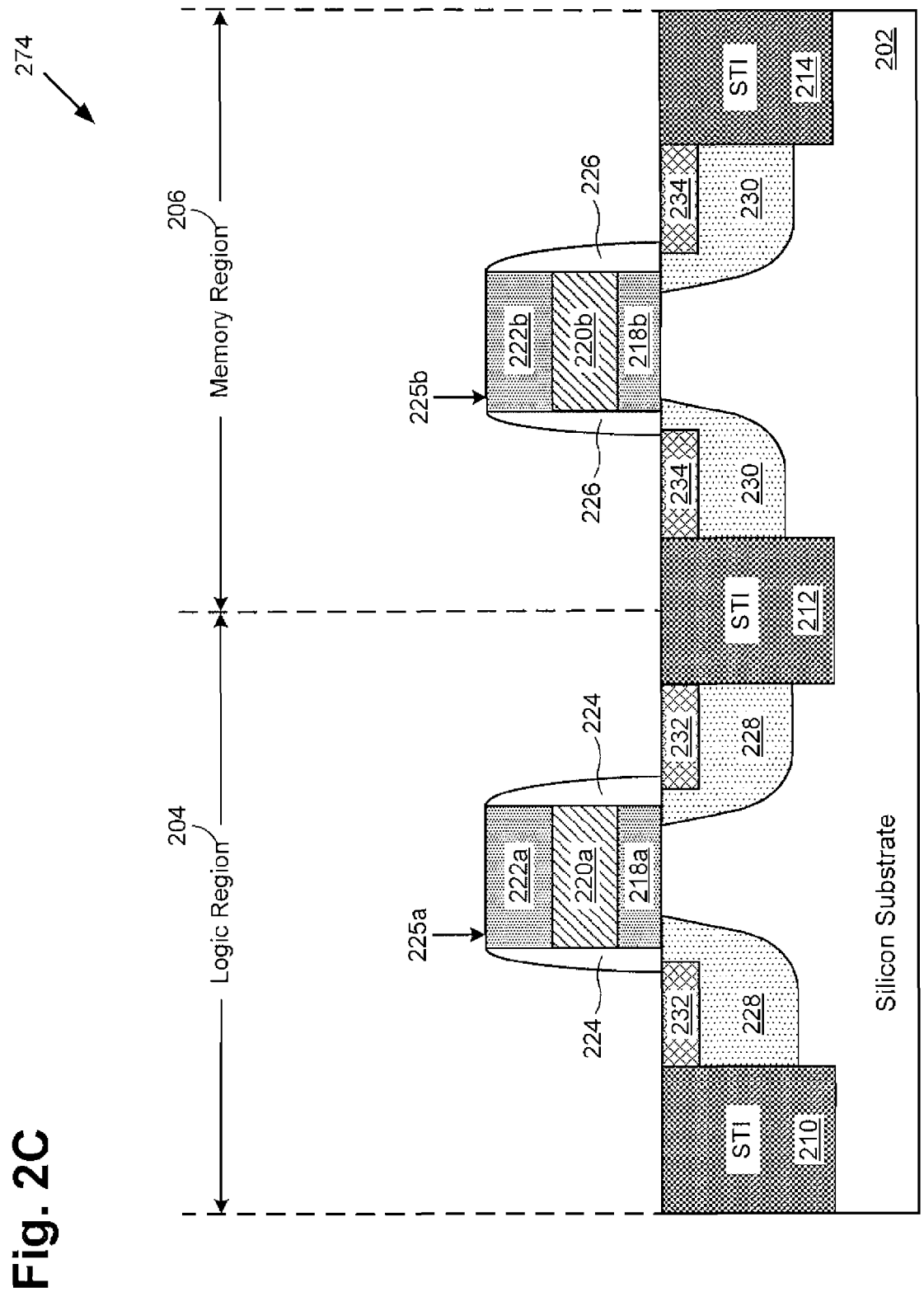
FIG. 2C illustrates a cross-sectional view, which includes a portion of a wafer processed according to an embodiment of the invention, corresponding to an intermediate step in the flowchart in FIG. 1.

The present invention is directed to a method for efficiently fabricating memory cells with logic FETs and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and arc not specifically illustrated by the present drawings.

FIG. 1 shows a flow chart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 182 indicated in flowchart 100 are sufficient to describe at least one embodiment of the present invention; however, other embodiments of the invention may utilize steps different from those shown in flowchart 100. It is noted that the processing steps shown in flowchart 100 are performed on a portion of processed wafer, which, prior to step 170, includes, among other things, a substrate, such as a silicon substrate, conductive wells in the substrate, and isolation regions, such as shallow trench isolation (STI) regions, formed in memory and logic regions of the substrate. The wafer may also be referred to as a semiconductor die or simply a die in the present application.

Moreover, structures 270 through 282 in FIGS. 2A through 2O illustrate the result of performing steps 170 through 182 of flowchart 100, respectively. For example, structure 270 shows a semiconductor structure after processing step 170, structure 272 shows structure 270 after the processing of step 172, structure 274 shows structure 272 after the processing of step 174, and so forth.

Referring now to FIG. 2A, structure 270 of FIG. 2A shows a structure including a substrate, after completion of step 170 of flowchart 100 in FIG. 1. Structure 270 includes common substrate 202 (also referred to herein as "substrate"), isolation regions 210, 212, and 214, lower dielectric layer 218, polysilicon layer 220, and cap layer 222.

In structure 270, substrate 202, which is a silicon substrate in the present embodiment (but is not limited to a silicon substrate), includes logic region 204 and memory region 206. Logic region 204 is designated for logic FET (e.g. MOSFET) formation and memory region 206 is designated for memory cell (e.g. flash memory cell) formation. In some embodiments, logic region 204 is designated for formation of an N channel logic FET (NFET). Also, in some embodiments, logic region 204 is designated for formation of a P channel logic FET (PFET). Isolation regions 210, 212, and 214, which can be, for example, STI regions, are formed in substrate 202. Isolation regions 210, 212, and 214 can comprise silicon oxide or other dielectric material and can be formed in a manner known in the art.

Referring to step 170 in FIG. 1 and structure 270 in FIG. 2A, at step 170 of flowchart 100, in logic region 204 and memory region 206, lower dielectric layer 218 is formed over substrate 202, polysilicon layer 220 is formed over lower dielectric layer 218, and cap layer 222 is formed over polysilicon layer 220. In the present embodiment, lower dielectric layer 218, polysilicon layer 220, and cap layer 222 are blanket layers situated over isolation regions 210, 212, and 214 and substrate 202.

In the present embodiment, lower dielectric layer 218 and cap layer 222 are dielectric layers, and more particularly are oxide layers. Suitable materials for dielectric layer 218 and cap layer 222 include, as specific examples, silicon oxide and silicon nitride. In some embodiments, lower dielectric layer 218 and cap layer 222 are the same material and in other embodiments, dielectric layer 218 and cap layer 222 are different materials. In the present example, lower dielectric layer 218 comprises dielectric material that can form a floating gate dielectric of a memory cell and can have a thickness of, for example, between approximately 20.0 Angstroms and approximately 100.0 Angstroms. Also in the present example, cap layer 222 can have a thickness of, for example, approximately 100.0 Angstroms. Lower dielectric layer 218 and cap layer 222 can be formed, for example, by respectively depositing dielectric material over substrate 202 by utilizing a physical vapor deposition (PVD) process, a chemical vapor deposition (CVD) process, or other deposition process.

Also in the present embodiment, polysilicon layer 220 can form a floating gate of a memory cell. Polysilicon layer 220 can have a thickness of, for example, between approximately 200.0 Angstroms and approximately 1000.0 Angstroms. Polysilicon layer 220 can be formed, for example, by depositing a layer of polysilicon over lower dielectric layer 218 by utilizing a PVD process, a CVD process, or other deposition process. The layer of polysilicon may, for example, be doped during or after deposition. The result of step 170 of flowchart 100 is illustrated by structure 270 in FIG. 2A.

Referring to step 172 in FIG. 1 and structure 272 in FIG. 2B, at step 172 of flowchart 100, lower dielectric segment 218a, sacrificial polysilicon segment 220a, and cap segment 222a are formed in logic region 204, and lower dielectric segment 218b, polysilicon segment 220b, and cap segment 222b are formed in memory region 206.

As shown in FIG. 2B, in logic region 204, lower dielectric segment 218a is formed in substrate 202, sacrificial polysilicon segment 220a is situated over lower dielectric segment 218a, and cap segment 222a is situated over sacrificial polysilicon segment 220a. Similarly, in memory region 206, lower dielectric segment 218b is formed in substrate 202, polysilicon segment 220b is situated over lower dielectric segment 218b, and cap segment 222b is situated over polysilicon segment 220b.

In step 172, lower dielectric segment 218a is formed in substrate 202 in logic region 204 and lower dielectric segment 218b is concurrently formed in substrate 202 in memory region 206, Polysilicon segment 220b is formed over lower dielectric segment 218b in memory region 206, while sacrificial polysilicon segment 220a is concurrently formed over lower dielectric segment 218a in logic region 204. Cap segment 222b is formed over polysilicon segment 220b in memory region 206, while cap segment 222a is concurrently formed over sacrificial polysilicon segment 220a in logic region 204.

Lower dielectric segments 218a and 218b are portions of lower dielectric layer 218 (shown in FIG. 2A), sacrificial polysilicon segment 220a and polysilicon segment 220b are portions of polysilicon layer 220 (shown in FIG. 2A), and cap segments 222a and 222b are portions of cap layer 222 (shown in FIG. 2A).

Lower dielectric segment 218a, sacrificial polysilicon segment 220a, and cap segment 222a, and lower dielectric segment 218b, polysilicon segment 220b, and cap segment 222b can be formed by, for example, appropriately patterning lower dielectric layer 218, polysilicon layer 220, and cap layer 222 (each layer shown in FIG. 2A). The patterning process, which can include a masking step and an etch step, can expose top surface 216 of substrate 202 and can define gate length 223a for a logic FET and gate length 223b for a memory cell to be formed in logic region 204 and memory region 206 respectively. The result of step 172 of flowchart 100 is illustrated by structure 272 in FIG. 2B.

Referring to step 174 in FIG. 1 and structure 274 in FIG. 2C, at step 174 of flowchart 100, spacers 224, source/drain regions 228, and silicide segments 232 are formed in logic region 204, and spacers 226, source/drain regions 230, and silicide segments 234 are formed in memory region 206. Source/drain regions 228 are formed in substrate 202 adjacent to and under lower dielectric segment 218a, sacrificial polysilicon segment 220a, and cap segment 222a. Source/drain regions 230 are formed in substrate 202 adjacent to and under lower dielectric segment 218b, polysilicon segment 220b, and cap segment 222b. Source/drain regions 228 and 230 can be formed, for example, by implanting dopants into substrate 202 and performing an implant anneal to diffuse the dopants in substrate 202.

Spacers 224 are formed adjacent to and surround lower dielectric segment 218a, sacrificial polysilicon segment 220a, and cap segment 222a. Spacers 226 are formed adjacent to and surround lower dielectric segment 218b, polysilicon segment 220b, and cap segment 222b. Spacers 224 extend to top surface 225a of cap segment 222a and spacers 226 extend to top surface 225b of cap segment 222b. Spacers 224 and 226 can comprise silicon oxide or other dielectric material as is known in the art. Spacers 224 and 226 can be formed, for example, by conformally depositing a layer of dielectric material, such as silicon oxide, over substrate 202 and cap segments 222a and 222b, by utilizing a CVD process or other deposition process and appropriately etching the layer of dielectric material in an etch-back process.

Silicide segments 232 and 234 are formed on respective source/drain regions 228 and 230. Silicide segments 232 are formed adjacent to lower dielectric segment 218a, sacrificial polysilicon segment 220a, and cap segment 222a. Silicide segments 232 are formed adjacent to lower dielectric segment 218b, polysilicon segment 220b, and cap segment 222b. Silicide segments 232 and 234 can comprise a metal silicide, such as, for example, copper silicide, nickel silicide, nickel-platinum silicide or cobalt silicide, and can be formed in a manner known in the art. It is noted that cap segment 222b is formed over polysilicon segment 220b in memory region 206 and cap segment 222a is formed over sacrificial polysilicon segment 220a in logic region 204 thereby preventing silicidation of polysilicon segment 220b and sacrificial polysilicon segment 220a. Thus, silicide is not formed in top surface 225a of sacrificial polysilicon segment 220a or in top surface 225b of polysilicon segment 220b while forming silicide segments 232 and 234. The result of step 174 of flowchart 100 is illustrated by structure 274 in FIG. 2C.

Figure 2D:
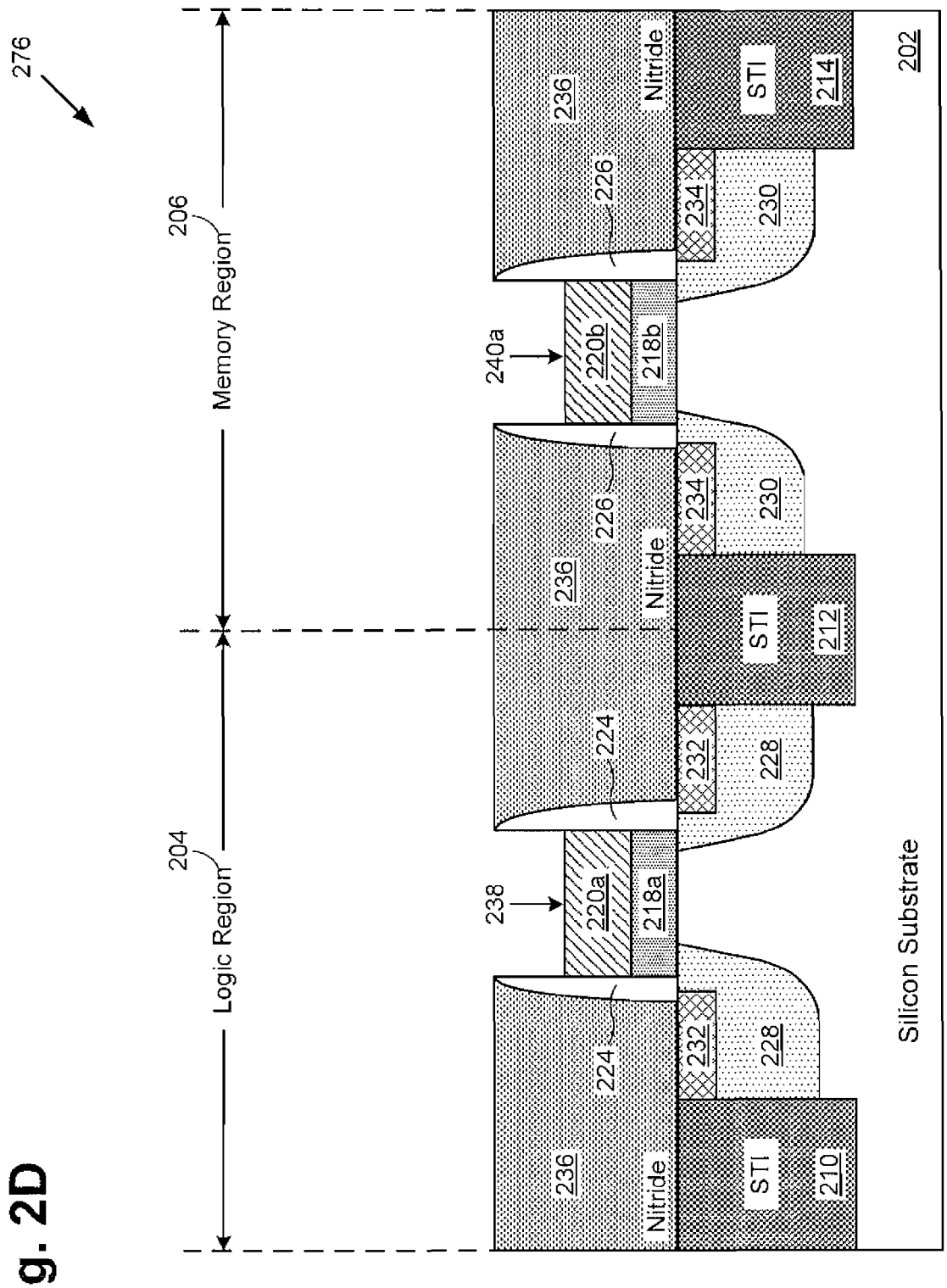
FIG. 2D illustrates a cross-sectional view, which includes a portion of a wafer processed according to an embodiment of the invention, corresponding to an intermediate step in the flowchart in FIG. 1.

Referring to step 176 in FIG. 1 and structure 276 in FIG. 2D, at step 176 of flowchart 100, interlayer dielectric 236 is formed over substrate 202 and cap segments 222a and 222b (shown in FIG. 2C) are removed from logic region 204 and memory region 206. As shown in FIG. 2D, interlayer dielectric 236 is formed on and surrounds spacers 224 and 226. Interlayer dielectric 236 comprises dielectric material, and in the present embodiment, is a nitride. In other embodiments, interlayer dielectric 236 can be an oxide or other dielectric material.

In step 176, interlayer dielectric 236 can be formed by depositing dielectric material over substrate 202 and cap segments 222a and 222b (shown in FIG. 2C) by utilizing a physical vapor deposition (PVD) process, a chemical vapor deposition (CVD) process, or other deposition process and planarizing the dielectric material by utilizing a chemical mechanical planarization (CMP), or other planarization process. In the present embodiment, interlayer dielectric 236 is formed coplanar with top surfaces 225a and 225b (shown in FIG. 2C). Cap segments 222a and 222b can then be removed by selectively etching cap segments 222a and 222b by utilizing a selective etch, such as an oxide selective etch, or other etch process to expose top surface 238 of sacrificial polysilicon segment 220a and top surface 240a of polysilicon segment 220b. By utilizing a selective etch, cap segments 222a and 222b can be removed without removing interlayer dielectric 236, sacrificial polysilicon segment 220a and polysilicon segment 220b. The result of step 176 of flowchart 100 is illustrated by structure 276 in FIG. 2D.

Figure 2E:
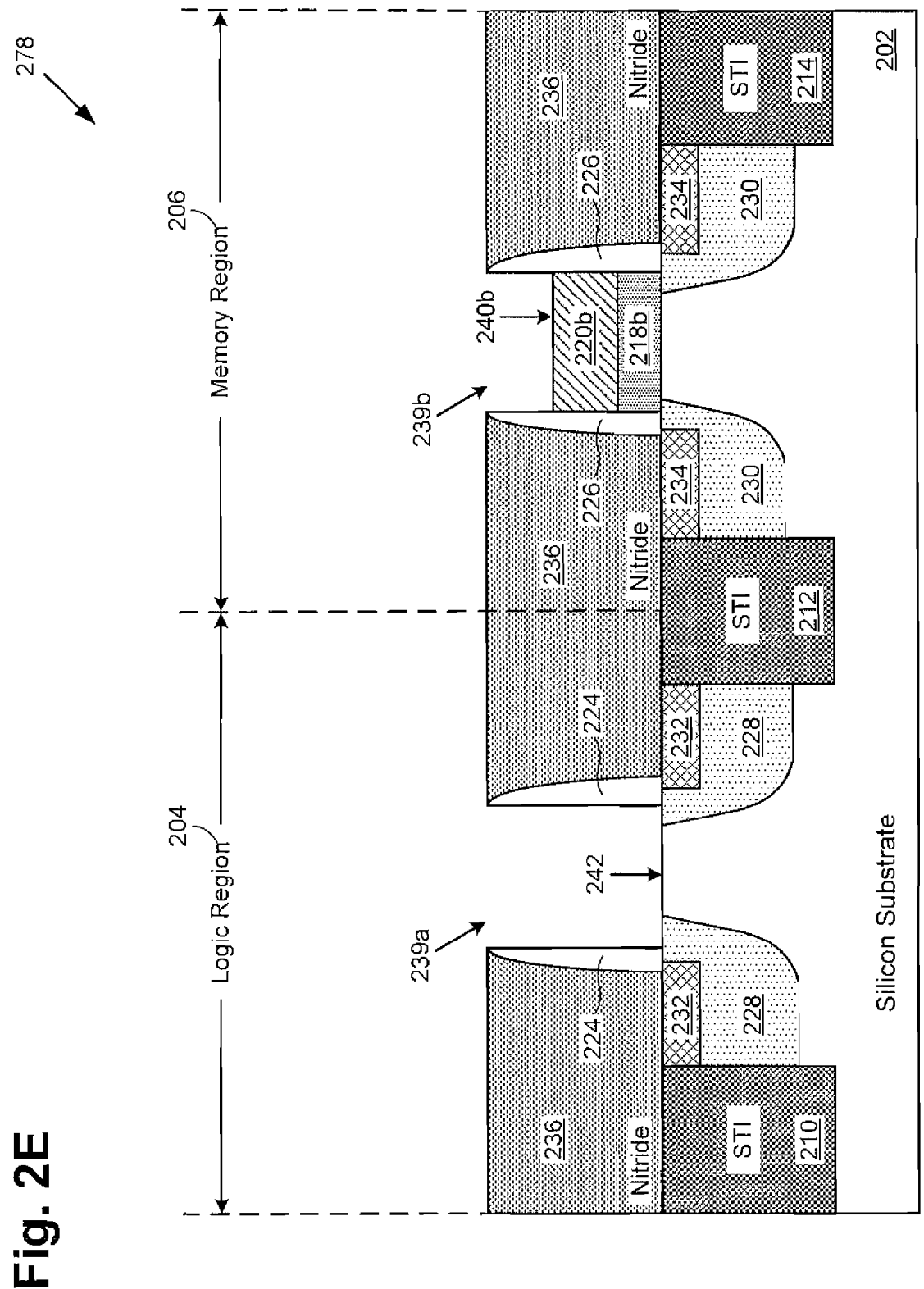
FIG. 2E illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2E, at step 178 of flowchart 100, lower dielectric segment 218a and sacrificial polysilicon segment 220a (both shown in FIG. 2D) are removed from logic region 204 without removing lower dielectric segment 218b and polysilicon segment 220b from memory region 206.

Lower dielectric segment 218a and sacrificial polysilicon segment 220a can be removed, for example, by utilizing a masking step and an etch step. The masking step can be performed on structure 276 in FIG. 2D by forming a mask with, for example, a photoresist material over interlayer dielectric 236 and polysilicon segment 220b and between spacers 226 in memory region 206 where the photoresist material is not over sacrificial polysilicon segment 220a (shown in FIG. 2D) in logic region 204. The etching step can be performed to remove lower dielectric segment 218a and sacrificial polysilicon segment 220a exposing surface 242 of substrate 202 and forming opening 239a. The mask can be removed exposing top surface 240b of polysilicon segment 220b to form opening 239b, resulting in structure 278 shown in FIG. 2E.

In the present embodiment, a portion of polysilicon layer 220 (shown in FIG. 2A) can form a current resistor in substrate 202 (not shown in FIGS. 2A-2G). The masking and etch steps described above can be shared with masking and etch steps for forming the current resistor. For example, the masking an etch steps can leave the portion of polysilicon layer 220 for the current resistor similar to polysilicon segment 220b shown in FIG. 2E. Thus, step 178 can be utilized for forming a current resistor without requiring additional making and etch steps, thereby avoiding increased manufacturing cost. The result of step 178 of flowchart 100 is illustrated by structure 278 in FIG. 2E.

Figure 2F:
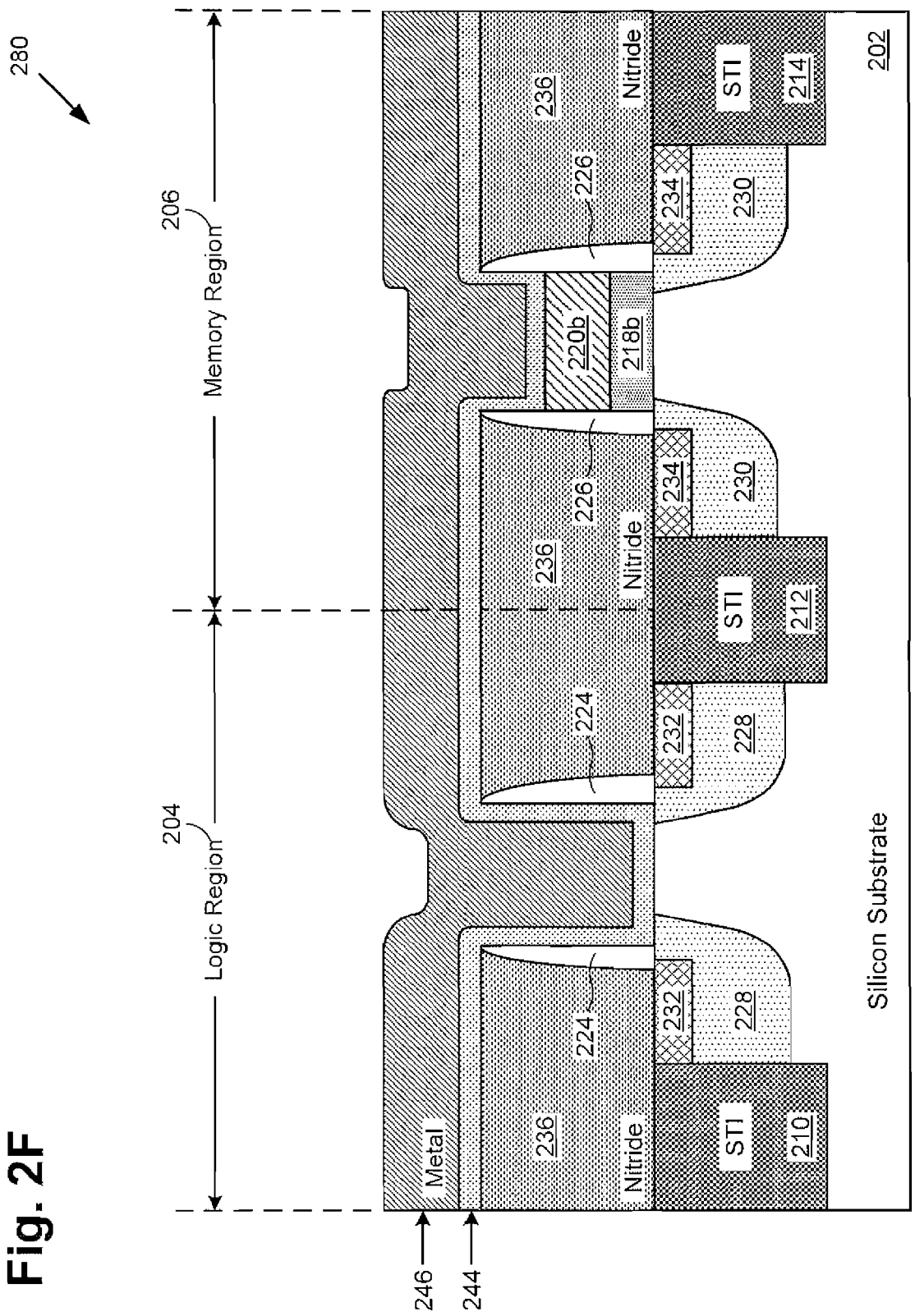
FIG. 2F illustrates a cross-sectional view, which includes a portion of a wafer processed according to an embodiment of the invention, corresponding to an intermediate step in the flowchart in FIG. 1.

Referring to step 180 in FIG. 1 and structure 280 in FIG. 2F, at step 180 of flowchart 100, high-k layer 244 and metal layer 246 are formed over substrate 202 in logic region 204 and memory region 206. In the present embodiment, high-k layer 244 and metal layer 246 are blanket layers filing openings 239a and 239b (shown in FIG. 2E).

In the present embodiment, high-k layer 244 comprises high-k dielectric material that can form a control gate dielectric of a memory cell and a transistor gate dielectric of a logic FET. Suitable materials for high-k layer 244 include, as specific examples, hafnium oxide ($HfO_2$), zirconium oxide ($ZrO_2$), chromium oxide ($CrO_2$), and the like. High-k layer 244 can be formed, for example, by depositing high-k dielectric material over interlayer dielectric 236 and substrate 202 by utilizing a physical vapor deposition (PVD) process, a chemical vapor deposition (CVD) process, or other deposition process.

Also in the present embodiment, metal layer 246 is a metal that can form a control gate of a memory cell and a metal gate of a logic FET. Suitable materials for metal layer 246 include, as specific examples, tantalum (Ta), tantalum nitride (TaN), titanium nitride (TiN), or other metal or metal stack. Metal layer 246 can be formed, for example, by depositing a layer of metal over high-k layer 244 by utilizing a PVD process, a CVD process, or other deposition process. The result of step 180 of flowchart 100 is illustrated by structure 280 in FIG. 2F.

Figure 2G:
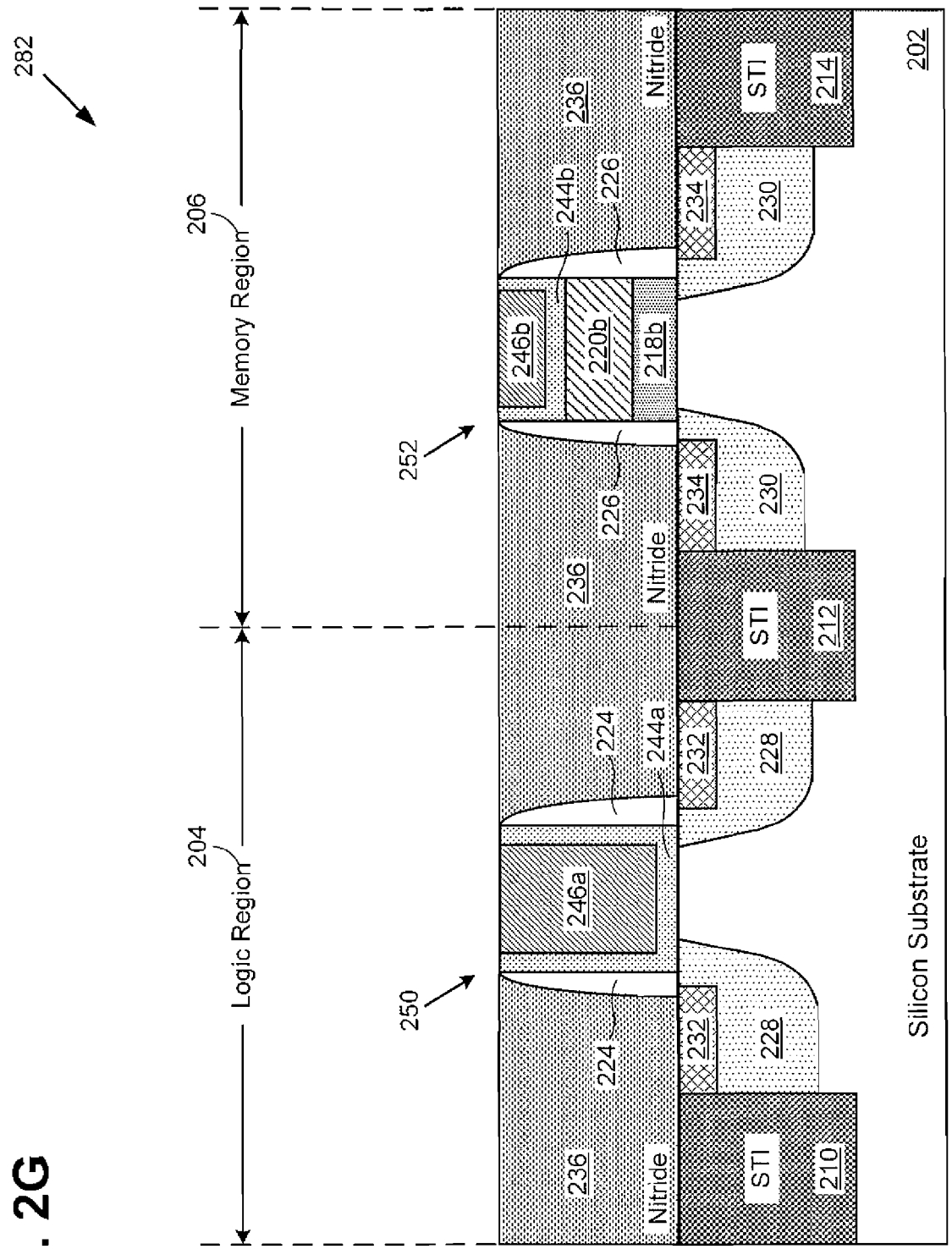
FIG. 2G illustrates a cross-sectional view, which includes a portion of a wafer processed according to an embodiment of the invention, corresponding to a final step in the flowchart in FIG. 1.

Referring to step 182 in FIG. 1 and structure 282 in FIG. 2G, at step 182 of flowchart 100, high-k segment 244a and metal segment 246a are formed in logic region 204 and. high-k segment 244b and metal segment 246b are formed in memory region 206. High-k segment 244a is formed in logic region 204 over substrate 202 and high-k segment 244b is formed in memory region 206 over polysilicon segment 220b. Metal segment 246a is formed over high-k dielectric 244a in logic region 204 and metal segment 246b is formed over high-k dielectric 244b in memory region 206.

High-k segments 244a and 244b are portions of high-k layer 244 (shown in FIG. 2F) and metal segments 246a and 246b are portions of metal layer 246 (shown in FIG. 2F). High-k segments 244a and 244b and metal segments 246a and 246b can be formed, for example, by utilizing a chemical mechanical planarization (CMP), or other planarization process. Additional steps may be performed to form memory cell 252 and logic FET 250 utilizing known techniques, which will not be described in order not to obscure the invention. FIG. 3G shows, memory cell 252 and logic FET 250 formed within interlayer dielectric 236, which is a nitride. The result of step 182 of flowchart 100 is illustrated by structure 282 in FIG. 2G.

Thus, as described above, embodiments of the present invention can provide for structure 282, which is a semiconductor die, comprising memory region 206 concurrently fabricated with logic region 204 in substrate 202. Memory region 206 can advantageously be fabricated with logic region 204 in an SoC by utilizing advanced process technologies, such as 45.0 nanometer (nm) and smaller process technologies. For example, in the present embodiment, memory region 206 is fabricated with logic region 204 in an SoC by utilizing 28.0 nanometer (nm) process technologies.

Memory region 206 includes memory cell 252, which is a flash memory cell in the present embodiment, and has metal segment 246b over high-k segment 244b over polysilicon segment 220b situated over lower dielectric segment 218b in substrate 202. In the present embodiment, polysilicon segment 220b is a floating gate of memory cell 252, and metal segment 246b is a control gate of memory cell 252. Also, lower dielectric segment 218b is a floating gate dielectric of memory cell 252 and high-k segment 244b is a control gate dielectric of memory cell 252. Logic region 204 includes logic FET 250 having metal segment 246a over high-k segment 244a in substrate 202. In the present embodiment, metal segment 246a is a metal gate of logic FET 250 and high-k segment 244a is a transistor gate dielectric of logic FET 250.

Sacrificial poly segment 220a and lower dielectric segment 218a (shown in FIG. 2D) have been removed from logic region 204, and thus are not shown in FIG. 2G. Also, in the present embodiment, metal segment (e.g. metal gate) 246a and metal segment 246b are formed from metal layer 246 (shown in FIG. 2F), and high-k segment (e.g. transistor gate dielectric) 244a and high-k segment 244b are formed from high-k layer 244 (shown in FIG. 2F). Thus, metal segment 246a comprises the same material as metal segment 246b and high-k segment 244a comprises the same material as high-k segment 244b. Furthermore, high-k segment 244a is approximately the same thickness as high-k segment 244b.

It will be appreciated that in other embodiments, logic FET 250 and memory cell 252 can include additional layers, not specifically described herein. In some embodiments, logic FET 250 is an N channel logic FET. In other embodiments, logic FET 250 is a P channel logic MT. Thus, metal segment 246a and high-k segment 244a can comprise materials selected to achieve a particular workfunction depending on whether logic FET 250 is an N channel logic FET or a P channel logic FET. In the present embodiment, metal segment 246b, which is a control gate of memory cell 252, is formed from metal layer 246 (shown in FIG. 2F) and high-k segment 244b, which is a control gate dielectric of memory cell 252, is formed from high-k layer 244 (shown in FIG. 2F). However, in other embodiments, metal segment 246b and/or high-k segment 244b are formed from different layers than metal layer 246 and high-k layer 244, which may require additional masks and process steps. Furthermore, in some embodiments, metal segment 246b and high-k segment 244b are not in memory cell 252 and memory cell 252 utilizes a polysilicon gate process to fabricate its control gate.

Thus, as described above, in the embodiments in FIGS. 1, and 2A through 2G, embodiments of the present invention can provide for a memory region, such as memory region 206 having memory cell 252, that can be concurrently fabricated with a logic region, such as logic region 204 having logic FET 250. As described above, in step 178, sacrificial poly segment 220a and lower dielectric segment 218a are removed from logic region 204. Sacrificial poly segment 220a and lower dielectric segment 218a in logic region 204, can be used to define gate length 223a for logic FET 250. Thus, for example, in step 174, spacers 224, source/drain regions 228, and silicide segments 232 are formed in logic region 204, in step 178, sacrificial poly segment 220a and lower dielectric segment 218a are removed forming opening 239a, and in step 184, metal segment 246a and high-k segment 244a are formed in opening 239a.

Sacrificial polysilicon segment 220a and lower dielectric segment 218a can advantageously withstand high temperature processes, such as the implant anneal for source/drain regions 228, whereas a metal segment and a high-k segment, such as metal segment 246a and high-k segment 244a, may not be capable of withstanding the high temperature processes. In the present embodiment, metal segment 246a and high-k segment 244a are formed after the high temperature processes. Thus, embodiments of the present invention advantageously allow for utilizing a high dielectric constant (high-k) metal gate process.

Also in the present embodiment, polysilicon segment 220b is formed over lower dielectric segment 218b in substrate 202 in memory region 206 concurrently with sacrificial polysilicon segment 220a being formed over lower dielectric segment 218a in logic region 204. For example, in step 172, polysilicon segment 220b, which is a floating gate of memory cell 252, and sacrificial polysilicon segment 220a are formed from polysilicon layer 220. Also, lower dielectric segment 218b, which is a floating gate dielectric of memory cell 252, and lower dielectric segment 218a are formed from lower dielectric layer 218. Thus, memory region 206 can be efficiently fabricated with logic region 204, by utilizing a polysilicon (e.g., poly-SiON) gate process for memory cell 252, without requiring additional masks and process steps. The polysilicon gate process for memory cell 252 is advantageously compatible with the high dielectric constant (high-k) metal gate process for logic FET 250.

Furthermore, in the present embodiment, metal segment 246b is formed over high-k segment 244b of memory cell 252 concurrently with metal segment 246a being formed over high-k segment 244a of logic FET 250. For example, in step 182, metal segment 246a, which is a metal gate of logic FET 250, and metal segment 246b, which is a control gate of memory cell 252, are formed from metal layer 246. Also, high-k segment 244a, which is transistor gate dielectric of logic FET 250, and high-k segment 244b, which is a control gate dielectric of memory cell 252, are formed from high-k layer 244. Conventionally, memory cells, such as flash memory cells, can include a floating gate and an overlying control gate, where the floating gate and the control gate are fabricated by utilizing a polysilicon (e.g., poly-SiON) gate process. This can require additional masks and process steps. However, in the present embodiment, metal segment 246b is efficiently formed over high-k segment 244b of memory cell 252, without requiring additional masks and process steps by utilizing a high-k metal gate process.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A method for concurrently fabricating a memory region with a logic region on a common substrate, said method comprising:

forming a lower dielectric segment in each of said memory and logic regions over said common substrate in a stacking direction;

forming a polysilicon layer over said lower dielectric segment in said stacking direction in each of said memory and logic regions;

etching said polysilicon layer to form a polysilicon segment in said memory region and a sacrificial polysilicon segment in said logic region;

forming a first spacer in said logic region and a second spacer in said memory region, said first spacer being adjacent to said sacrificial polysilicon segment in a first direction that is perpendicular to said stacking direction, and said second spacer being adjacent to said polysilicon segment in said first direction;

removing said lower dielectric segment and said sacrificial polysilicon segment from said logic region;

forming a first high-k segment in said logic region over said common substrate in said stacking direction and adjacent to said first spacer in said first direction;
forming a second high-k segment in said memory region over said polysilicon segment in said stacking direction and adjacent to said second spacer in said first direction;
forming a first metal segment over said first high-k segment in said logic region in said stacking direction; and
forming a second metal segment over said second high-k segment in said memory region in said stacking direction.

2. The method of claim 1, wherein said polysilicon segment is a floating gate of a memory cell in said memory region.

3. The method of claim 1, wherein said lower dielectric segment in said memory region is a floating gate dielectric of a memory cell in said memory region.

4. The method of claim 1, wherein said first high-k segment is a transistor gate dielectric of a logic field-effect transistor (FET), and said first metal segment is a metal gate of said logic FET.

5. The method of claim 1 further comprising forming a source/drain region adjacent to said polysilicon segment in said memory region and adjacent to said sacrificial polysilicon segment in said logic region.

6. The method of claim 1 further comprising forming a cap segment over said polysilicon segment in said memory region and over said sacrificial polysilicon segment in said logic region, wherein
the cap prevents silicidation of said polysilicon segment and said sacrificial polysilicon segment.

7. The method of claim 1 wherein said second metal segment in said memory region is a control gate of said memory cell.

8. The method of claim 1, wherein said second high-k segment in said memory region is a control gate dielectric of a memory cell in said memory region.

9. The method of claim 1, wherein said polysilicon segment is in contact with the second high-k segment.

10. The method of claim 1, wherein the first high-k segment includes a first part that is between the first spacer and the first metal segment and a second part that is between the first metal segment and the common substrate.

11. A semiconductor die, comprising:
a common substrate including a logic region and a memory region;
a logic field-effect transistor (FET) in said logic region, said logic FET having a first spacer and a metal gate that is over a transistor gate dielectric segment on said common substrate in a stacking direction, wherein
said logic FET is formed by a sacrificial polysilicon segment and a lower dielectric segment having been removed from said logic region,
said metal gate and a first metal segment are formed from a metal layer,
said transistor gate dielectric segment and a first high-k segment are formed from a high-k layer, and
said first spacer is adjacent to said sacrificial polysilicon segment and said first high-k segment in a first direction that is perpendicular to the stacking direction; and
a memory cell in said memory region, said memory cell having a polysilicon segment formed over a lower dielectric segment on said common substrate, a second high-k segment over the polysilicon segment, a second metal segment over the second high-k segment and a second spacer that are adjacent to said polysilicon segment and said second high-k segment in said first direction, wherein
the logic FET in the logic region and the memory cell in the memory region are concurrently fabricated upon the common substrate.

12. The semiconductor die of claim 11, wherein said polysilicon segment is a floating gate of said memory cell, and said second metal segment is a control gate of said memory cell.

13. The semiconductor die of claim 11, wherein said lower dielectric segment is a floating gate dielectric of said memory cell.

14. The semiconductor die of claim 11, wherein said second high-k segment is a control gate dielectric of said memory cell.

15. The semiconductor die of claim 11, wherein said lower dielectric segment comprises an oxide.

16. The semiconductor die of claim 11, where said high-k segment is selected from the group consisting of hafnium oxide ($HfO_2$), zirconium oxide ($ZrO_2$), and chromium oxide ($CrO_2$).

17. The semiconductor die of claim 11, wherein said metal layer is selected from the group consisting of tantalum (Ta), tantalum nitride (TaN), and titanium nitride (TiN).

18. The semiconductor die of claim 11, wherein said memory cell and said logic FET are within an interlayer dielectric, said interlayer dielectric comprising a nitride.

19. The semiconductor die of claim 11, wherein said memory cell and said logic FET each comprises a source/drain region and a silicide segment formed on said source/drain region.

20. A semiconductor die, comprising:
a substrate including a logic region and a memory region;
a logic field-effect transistor (FET) in said logic region, said logic FET including a first high-k segment over the substrate in a stacking direction, and a first metal segment over the first high-k segment in the stacking direction, and a first spacer that is adjacent to said first high-k segment in a first direction that is perpendicular to the stacking direction; and
a memory cell in said memory region, said memory cell including a lower dielectric segment over said substrate in the stacking direction, a polysilicon segment over said lower dielectric segment in the stacking direction, a second high-k segment over the polysilicon segment in the stacking direction, a second metal segment over the second high-k segment in the stacking direction, and a second spacer that is adjacent to said polysilicon segment and said second high-k segment in the first direction.

* * * * *